US009063556B2

(12) United States Patent
Pahr

(10) Patent No.: US 9,063,556 B2
(45) Date of Patent: Jun. 23, 2015

(54) BANDGAP REFERENCE CIRCUIT WITH OFFSET VOLTAGE REMOVAL

(71) Applicant: OMNIVISION TECHNOLOGIES, INC., Santa Clara, CA (US)

(72) Inventor: Per Olaf Pahr, Gullaug (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 368 days.

(21) Appl. No.: 13/764,627

(22) Filed: Feb. 11, 2013

(65) Prior Publication Data

US 2014/0224962 A1 Aug. 14, 2014

(51) Int. Cl.
| | |
|---|---|
| H03K 17/78 | (2006.01) |
| H03F 3/08 | (2006.01) |
| H01L 27/00 | (2006.01) |
| G05F 3/02 | (2006.01) |
| G05F 1/02 | (2006.01) |
| H01L 27/146 | (2006.01) |

(52) U.S. Cl.
CPC ............ *G05F 3/02* (2013.01); *H03K 17/78* (2013.01); *G05F 1/02* (2013.01); *H01L 27/14601* (2013.01)

(58) Field of Classification Search
CPC ........ G05F 3/02; G05F 1/10; H01F 27/14601
USPC ........................................ 250/208.1; 323/313
See application file for complete search history.

(56) References Cited

U.S. PATENT DOCUMENTS 3,887,863 A 6/1975 Brokaw
5,059,820 A * 10/1991 Westwick ...................... 327/539
5,352,972 A * 10/1994 Pernici et al. ................. 323/313
6,462,612 B1 10/2002 Roh et al.
6,600,439 B1 * 7/2003 Pahr .............................. 341/158
6,690,228 B1 2/2004 Chen et al.
6,819,163 B1 * 11/2004 Gregoire, Jr. ................. 327/536
6,958,643 B2 10/2005 Rosenthal
7,211,993 B2 5/2007 Marinca
7,786,792 B1 * 8/2010 Gay .............................. 327/539
8,022,751 B2 9/2011 Le et al.
8,169,256 B2 5/2012 Yao et al.
8,207,724 B2 6/2012 Riehl

OTHER PUBLICATIONS

Wikipedia, Bandgap voltage reference, http://en.wikipedia.org/wiki/Brokaw_bandgap_reference (as of Nov. 12, 2012, 19:44 GMT).
Wikipedia, Brokaw bandgap reference, http://en.wikipedia.org/wiki/Brokaw_bandgap_reference (as of Dec. 24, 2012, 07:43 GMT).

* cited by examiner

*Primary Examiner* — Pascal M Bui Pho
*Assistant Examiner* — Vildana Hodzic
(74) *Attorney, Agent, or Firm* — Blakely Sokoloff Taylor & Zafman LLP

(57) ABSTRACT

An example bandgap reference circuit includes an amplifier, a first, a second, and a third switch, and a capacitor. The first switch is coupled between an inverting input and an output of the amplifier to provide a negative feedback loop around the amplifier when the first switch is closed. The capacitor has a first end coupled to the inverting input, and a second end coupled to the second switch, where the capacitor is charged to a voltage substantially equal to an offset voltage of the amplifier when the second switch is closed. The third switch is coupled to a second end of the capacitor, where the voltage across the capacitor is subtracted from an input loop of the reference circuit to cancel the offset voltage of the amplifier when the third switch is closed.

19 Claims, 4 Drawing Sheets

BANDGAP REFERENCE CIRCUIT WITH OFFSET VOLTAGE REMOVAL

BACKGROUND

1. Field of the Invention

This disclosure relates generally to bandgap voltage reference circuits, and in particular, but not exclusively, those used in the readout circuitry of a complementary metal-oxide-semiconductor (CMOS) image sensor.

2. Background Information

Image sensors are ubiquitous. They are widely used in digital still cameras, digital video cameras, cellular phones, security cameras, medical devices, automobiles, and other applications.

Many image sensors have an image quality that is limited by a number of factors. One such factor is the accuracy of the analog-to-digital converter(s) included in readout circuitry of the image sensor. An accurate analog-to-digital converter often requires a reference voltage that is both accurate and stable. Various circuits can be implemented to provide the reference voltage. One such example is a bandgap reference circuit.

Bandgap reference circuits are widely used in analog circuits for providing stable, voltage-independent, and temperature-independent reference voltages. Bandgap voltage reference circuits operate on the principle of maintaining an internal voltage source that has a positive temperature coefficient and another internal voltage source that has a negative temperature coefficient. By summing the two together, the temperature dependence can be cancelled. Additionally, either of the two internal sources can be used as a temperature sensor.

As the name suggests, the voltages generated by bandgap reference circuits are used as references, and in particular are utilized where high stability in the reference voltage is needed (e.g., as is often required in image sensors). In typical bandgap reference circuits, operational amplifiers are used in order to improve the accuracy of the reference voltages. However, operational amplifiers themselves are not ideal, and have offset voltages. Ideally, voltages at the inputs of the operational amplifier should equal each other due to the virtual short between the inputs of amplifier. However, in practical cases, the offset voltage Vos is almost always present. Furthermore, the offset voltages Vos vary from chip to chip instead of being a fixed value. Thus, the output voltages Vout also vary from chip to chip attributed to the distribution of offset voltages Vos, making it difficult to compensate for such a variation.

Some conventional techniques for compensating for the offset voltages present in operational amplifiers include "high-frequency (HF) chopper techniques," and "auto-zeroing techniques." However, such chopper stabilization and auto-zeroing are based on high-frequency switching during the critical row-time of the image sensor. The high-frequency switching may couple high-frequency currents into the bandgap reference output or generate high-frequency voltages in common "ground paths." Thus, the accuracy of the bandgap voltage output may be reduced which may cause the bandgap reference circuit to be incompatible with image sensors that have high resolution analog-to-digital converters.

BRIEF DESCRIPTION OF THE DRAWINGS

The invention may be understood by referring to the following description and accompanying drawings that are used to illustrate embodiments. In the drawings.

DETAILED DESCRIPTION

In the following description, numerous specific details are set forth, such as, for example, specific readout circuits, voltage ramp signals, calibration circuits orders of operations, etc. However, it is understood that embodiments may be practiced without these specific details. In other instances, well-known circuits, structures and techniques have not been shown in detail in order not to obscure the understanding of this description.

Figure 1:
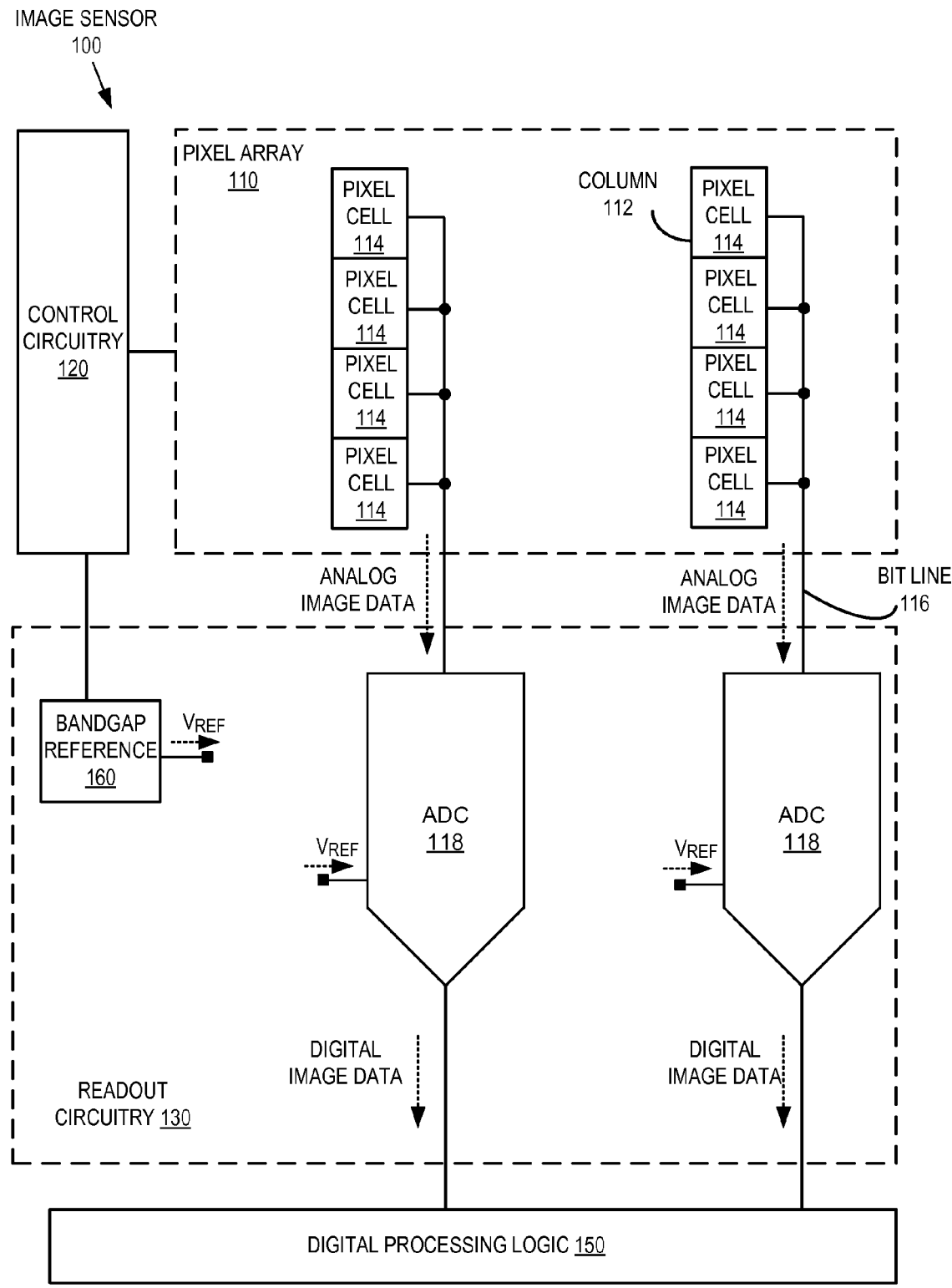
FIG. 1 is a block diagram illustrating an image sensor having a readout circuit that includes a bandgap reference circuit and multiple ADCs, in accordance with an embodiment of the present disclosure.

FIG. 1 is a block diagram illustrating image sensor 100 having multiple analog-to-digital converters (ADCs) 118, in accordance with an embodiment of the present disclosure. Image sensor 100 includes pixel array 110, control circuitry 120, readout circuitry 130, and optional digital processing logic 150. For simplicity of illustration, the illustrated embodiment of pixel array 110 only shows two columns 112, each having four pixel cells 114. However, it is to be appreciated that actual image sensors commonly include from hundreds to thousands of columns, and each column commonly includes from hundreds to thousands of pixels. Also, the illustrated pixel array 110 is regularly shaped (e.g., each column 112 has the same number of pixels), but in other embodiments the array may have a regular or irregular arrangement different than shown and can include more or less pixels, rows, and columns than shown. Moreover, in different embodiments pixel array 110 may be a color image sensor including red, green, and blue pixels designed to capture images in the visible portion of the spectrum, or may be a black-and-white image sensor and/or an image sensor designed to capture images in the invisible portion of the spectrum, such as infra-red or ultraviolet. In one embodiment, image sensor 100 is a complementary metal oxide semiconductor (CMOS) image sensor.

During use, after pixel cell 114 has acquired its image data or charge, the analog image data (e.g., analog signal) or charge may be read out of the pixel cell to readout circuitry 130 via column readout lines or bit lines 116. The analog image data from pixel cells 114 of each column 112 is read out via bit line 116 one pixel at a time to readout circuitry 130 and then transferred to ADCs 118.

ADCs 118 may be any type of ADC and in the illustrated embodiment are ADCs which require a reference voltage $V_{REF}$. For example, ADCs 118 may be a flash ADC, a successive-approximation ADC, an integrating ADC, a pipeline ADC, or any other ADC which requires a reference voltage. As shown in FIG. 1, reference voltage $V_{REF}$ is generated by bandgap reference circuit 160. In one embodiment, Bandgap reference circuit 160 may include a Brokaw bandgap reference circuit. However, as mentioned above, the operational amplifier included in the bandgap reference circuit often has an associated offset voltage at the inputs of the amplifier. Conventional methods attempting to mitigate this problem include increasing the size of the MOS devices and/or by circuit trimming. However, both of these methods are costly. Thus, embodiments of a bandgap reference circuit disclosed herein, include a capacitor for sampling the offset voltage of the operational amplifier and then applying the sampled offset voltage to an input loop of the reference circuit to cancel (i.e., remove) the offset voltage. Thus, embodiments of the present disclosure may remove the offset or mismatch voltages often associated with CMOS current mirror or differential pairs in CMOS amplifiers. Furthermore, the effects of charge injection errors may be reduced. These and other embodiments will be discussed in more detail below.

Figure 2:
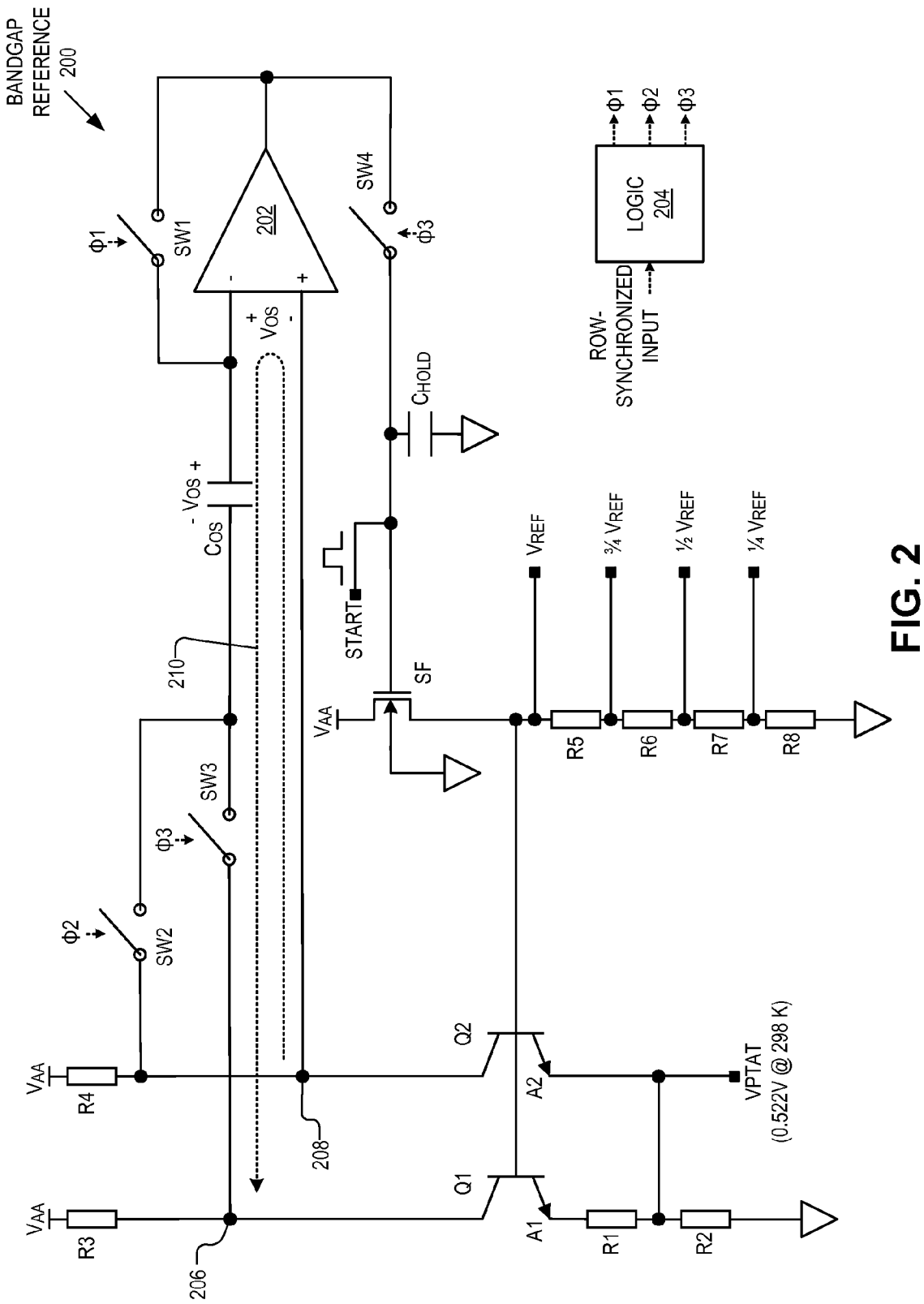
FIG. 2 is a block diagram illustrating an example bandgap reference circuit, in accordance with an embodiment of the present disclosure.

FIG. 2 is a block diagram illustrating an example bandgap reference circuit 200, in accordance with an embodiment of the present disclosure. The illustrated example of bandgap reference circuit 200 is shown as including an operational transconductance amplifier (OTA) 202, switches SW1-SW4, resistors R1-R8, bipolar transistors Q1 and Q2, a source follower transistor SF, offset capacitor $C_{OS}$, hold capacitor $C_{HOLD}$, logic 204, and circuit nodes 206 and 208. Bandgap reference circuit 200 is one possible implementation of bandgap reference circuit 160 of FIG. 1.

In one embodiment OTA 202 is an amplifier whose differential input voltage produces an output current. Thus, OTA 202 may operate as a voltage controlled current source (VCCS). OTA 202 is shown as including an inverting input (−) and a non-inverting input (+). As shown, OTA 202 typically has a substantial offset voltage $V_{OS}$, due to, for example, circuit asymmetries caused by device size mismatching. This offset may cause an error to be introduced into the output of OTA 202. Accordingly, embodiments of the present disclosure include offset capacitor $C_{OS}$ to selectively sample the offset voltage $V_{OS}$, which is then subtracted from the input loop 210 of bandgap reference circuit 200 to cancel the offset voltage $V_{OS}$ of OTA 202. Input loop 210, as used herein, refers to the voltage taken, counterclockwise, starting at node 208, across the input terminals of OTA 202, across offset capacitor $C_{OS}$, to node 206, when switch SW3 is closed.

As shown in FIG. 2, offset capacitor $C_{OS}$ has a first end coupled to the inverting input of OTA 202. A second end of the offset capacitor $C_{OS}$ is coupled to both switch SW2 and to switch SW3. Switches SW2 and SW3 are controlled by signals 2 and 3, respectively, to selectively coupled the second end of offset capacitor $C_{OS}$ to either node 206 or to node 208, respectively. For example, with switch SW2 open and switch SW3 closed, offset capacitor $C_{OS}$ is coupled to node 206. Conversely, with switch SW2 closed and SW3 open, offset capacitor $C_{OS}$ is coupled to node 208. The non-inverting input of OTA 202 is also coupled to node 208. Thus, when signals 2 and 3 couple the second end of offset capacitor $C_{OS}$ to node 208, offset capacitor $C_{OS}$ is charged to a voltage substantially equal to the offset voltage $V_{OS}$. Also, when signals 2 and 3 couple the second end of offset capacitor $C_{OS}$ to node 206, the sampled voltage (i.e., $V_{OS}$) across offset capacitor $C_{OS}$ is subtracted from the input loop 210 of reference circuit 200 to cancel the offset voltage $V_{OS}$ of OTA 202.

Switch SW1 is coupled between the inverting input and an output of OTA 202. Switch SW1 is controlled by signal 1 to provide a negative unity gain feedback loop around the OTA 202 when switch SW1 is closed. When switch SW1 is open OTA 202 is in an open loop mode.

Switch SW4 has one end coupled to the output of OTA 202. The other end of switch SW4 is coupled to hold capacitor $C_{HOLD}$. As illustrated, switch SW4 is controlled by the same signal 3 that is used to control switch SW3. Thus, when switch SW3 is closed to couple the offset capacitor $C_{OS}$ to node 206, switch SW4 is also closed to allow the output of OTA 202 to charge the hold capacitor $C_{HOLD}$. The voltage developed across the hold capacitor $C_{HOLD}$ is then provided to the control terminal of the source follower transistor SF. In one embodiment, source follower transistor SF is a metal oxide semiconductor field effect transistor (MOSFET), where the control terminal is the gate of the MOSFET. Source follower transistor SF is used as a voltage buffer where the control terminal is the input and the source is the output that provides a reference voltage output $V_{REF}$ of the bandgap reference circuit 200. A resistor divider including resistors R5-R8 is also coupled to the reference voltage output $V_{REF}$ to provide scaled versions of the reference voltage $V_{REF}$.

The reference voltage output $V_{REF}$ is also coupled to provide a common-mode voltage to the bases of bipolar transistors Q1 and Q2. The emitter of bipolar transistor Q1 is coupled to two series-connected resistors R1 and R2, while the emitter of bipolar transistor Q2 is coupled to the node between resistors R1 and R2. In one embodiment, the resistor ratio R1/R2 is 16/5. The collector of bipolar transistor Q1 is coupled to node 206, while the collector of bipolar transistor Q2 is coupled to node 208.

Bipolar transistors Q1 and Q2 are operated at different current densities (i.e., the density of current flowing through the emitters). In the embodiment of FIG. 2, transistor Q1 is operated at a smaller current density than that of transistor Q2. Such a difference in current densities can be produced by (1) using identical transistors operating at unequal currents, (2) using transistors having unequal emitter areas operating at equal currents, or (3) by some combination of the latter two arrangements. By way of example, in the illustrated embodiment of FIG. 2, the emitter areas, A1 and A2, of transistors Q1 and Q2, respectively, are different and the currents through the two transistors are equal. In one embodiment, the emitter area ratio A1/A2 is equal to 24. In another embodiment, the emitter area ratio A1/A2 is equal to 8. Bipolar transistors Q1 and Q2 may be well matched if Q2 is located in the middle of a 3×3 bipolar device array or a 5×5 bipolar device array, hence the 8:1 or 24:1 emitter area ratios.

The transistor currents of bipolar transistors Q1 and Q2 are forced to be equal by a negative feedback arrangement including equal-resistance resistors R3 and R4. Resistors R3 and R4 develop voltages which are proportional to the respective collector currents, and which are coupled to the input terminals of OTA 202 when switch SW3 is closed. Source follower transistor SF drives bipolar transistors in response to the output of OTA 202 until the voltage drops across the load resistors R3 and R4 are equal, thereby forcing the transistor collector currents to be equal. By using well matched transistors Q1 and Q2, the emitter currents also will be equal. As a result, the reference voltage $V_{REF}$ is regulated to the bandgap voltage of silicon (i.e., about 1.24 V), thereby providing an accurate and stable reference for use by other circuits (e.g., ADC 118 of FIG. 1).

Figure 3:
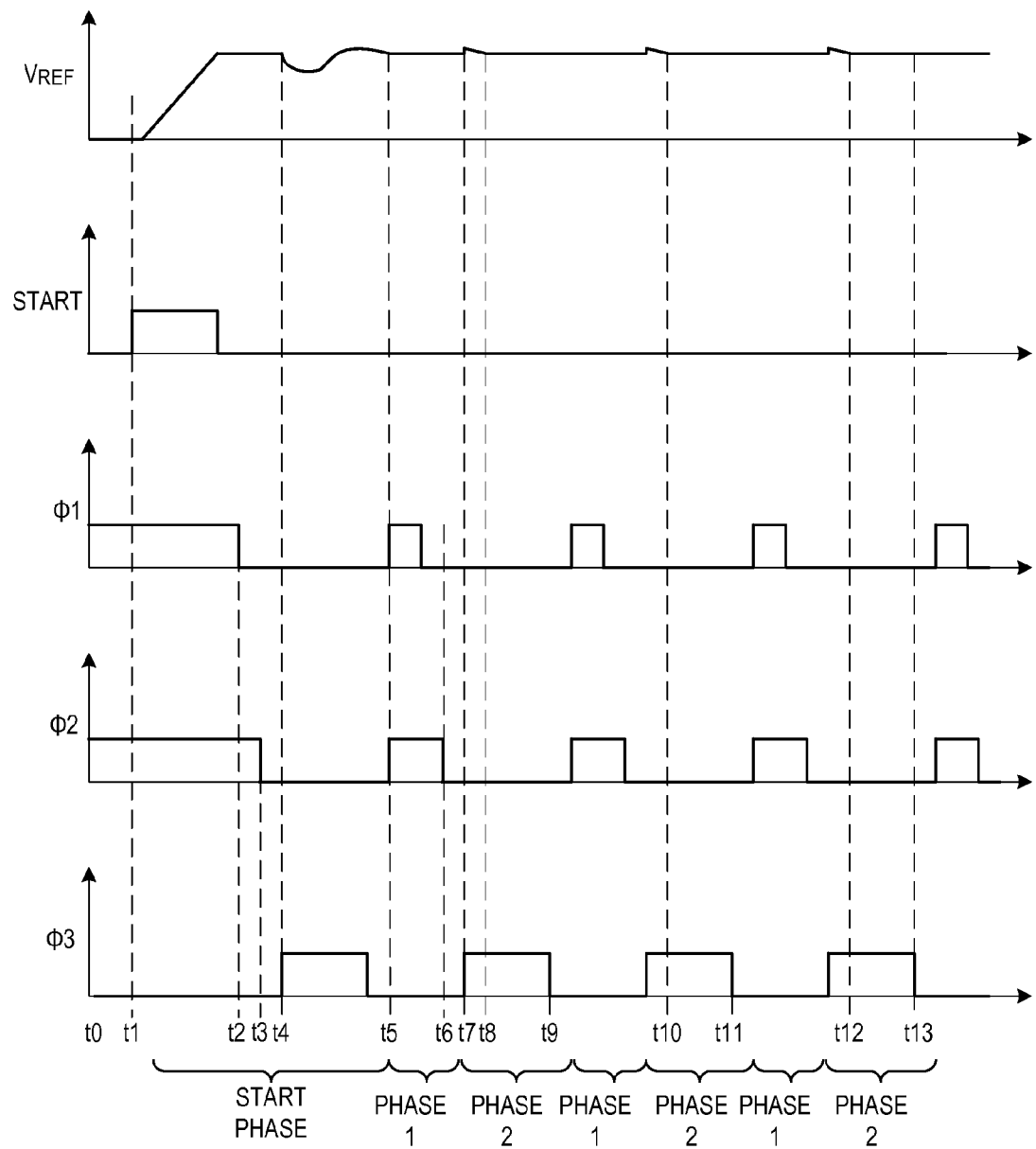
FIG. 3 is a timing diagram illustrating various waveforms of the bandgap reference circuit of FIG. 2.

FIG. 3 is a timing diagram illustrating various waveforms of the bandgap reference circuit 200 of FIG. 2. The operation of bandgap reference circuit 200 will now be described with reference to FIGS. 2 and 3. At time t1 a start phase of operation begins with signals 1 and 2, high and signal 3, low, thereby closing switches SW1 and SW2, and opening switches SW3 and SW4. Also at time t1, a start pulse START is received at the control terminal of the source follower transistor SF. In one embodiment, the start pulse START is received from control circuitry 120 of the image sensor 100 of FIG. 1, indicating the beginning of a readout phase of the pixel array 110. In response, the source follower transistor SF will supply the common-mode voltage $V_{REF}$ to the bases of bipolar transistor Q1 and Q2 causing these transistors to conduct. At this time a differential voltage exists between node 206 and node 208 due to the offset voltage $V_{OS}$. Thus, with offset capacitor $C_{OS}$ coupled to node 208, this capacitor charges to a voltage substantially equal to the offset voltage $V_{OS}$. Next, at the falling edge of signal 1, at time t2, switch SW1 is opened thereby breaking the unity gain negative feedback loop around OTA 202. Also, at time t2, charge injection from switch SW1 may appear as additional non-compensated offset voltage error on offset capacitor $C_{OS}$. This offset voltage error may be reduced by reducing the area of switch SW1 and increasing the area of capacitor $C_{OS}$. At this time, the inverting input of OTA 202 has become a CMOS "floating node" and no charge can escape offset capacitor $C_{OS}$ when SW2 opens at time t3.

Next, at time t4, signal 3 goes high thereby closing switches SW3 and SW4. This causes the feedback loop of OTA 202 to enter into a differential voltage sensing state with the sampled voltage (i.e., $V_{OS}$) across capacitor $C_{OS}$ subtracted from input loop 210. Measuring voltage counterclockwise in input loop 210 from node 208, the voltage will go up one $V_{OS}$ across the input terminals of OTA 202 and then down one $V_{OS}$ over the offset capacitor $C_{OS}$ to node 206. Thus, the offset voltage $V_{OS}$ of OTA 202 has been cancelled.

Although FIG. 3 shows a single start phase, embodiments of the present disclosure may require several start cycles in order for the reference voltage $V_{REF}$ to reach its final state of about 1.24 V. Once the final state is reached, bandgap reference circuit 200 may periodically refresh the reference voltage $V_{REF}$ by alternating between a first and second phase. The first phase (i.e., PHASE 1) being the sampling of the offset voltage $V_{OS}$ onto capacitor $C_{OS}$ with switches SW1 and SW2 closed, and with the second phase (PHASE 2) being the differential voltage sensing stage where $V_{REF}$ is regulated to its final value (e.g., 1.24 V). In one embodiment, the refresh of voltage reference $V_{REF}$ is synchronized with the readout of rows of a CMOS image sensor, such as image sensor 100 of FIG. 1.

As can be seen from FIG. 3, at time t7 to time t8, the voltage reference $V_{REF}$ may require settling time after switches SW3 and SW4 are closed at time t7. Thus, the synchronization with the readout of rows of image sensor 100 may be such that a row is only readout after the reference voltage $V_{REF}$ has settled (e.g., at time t8). Therefore the period between time t8 and t9 may correspond with the reading out (and digital conversion) of a first row of pixels 114, while the period between time t10 and t11 corresponds with the reading out of a second row of pixels 114, and so on. It is noted that embodiments of the present invention may have an advantage over conventional "chopper stabilization" and "auto-zeroing" techniques because no high frequency switching occurs in the time intervals when VREF is supplied to the ADC (e.g., interval t8 to t9, and interval t10 to t11).

Figure 4:
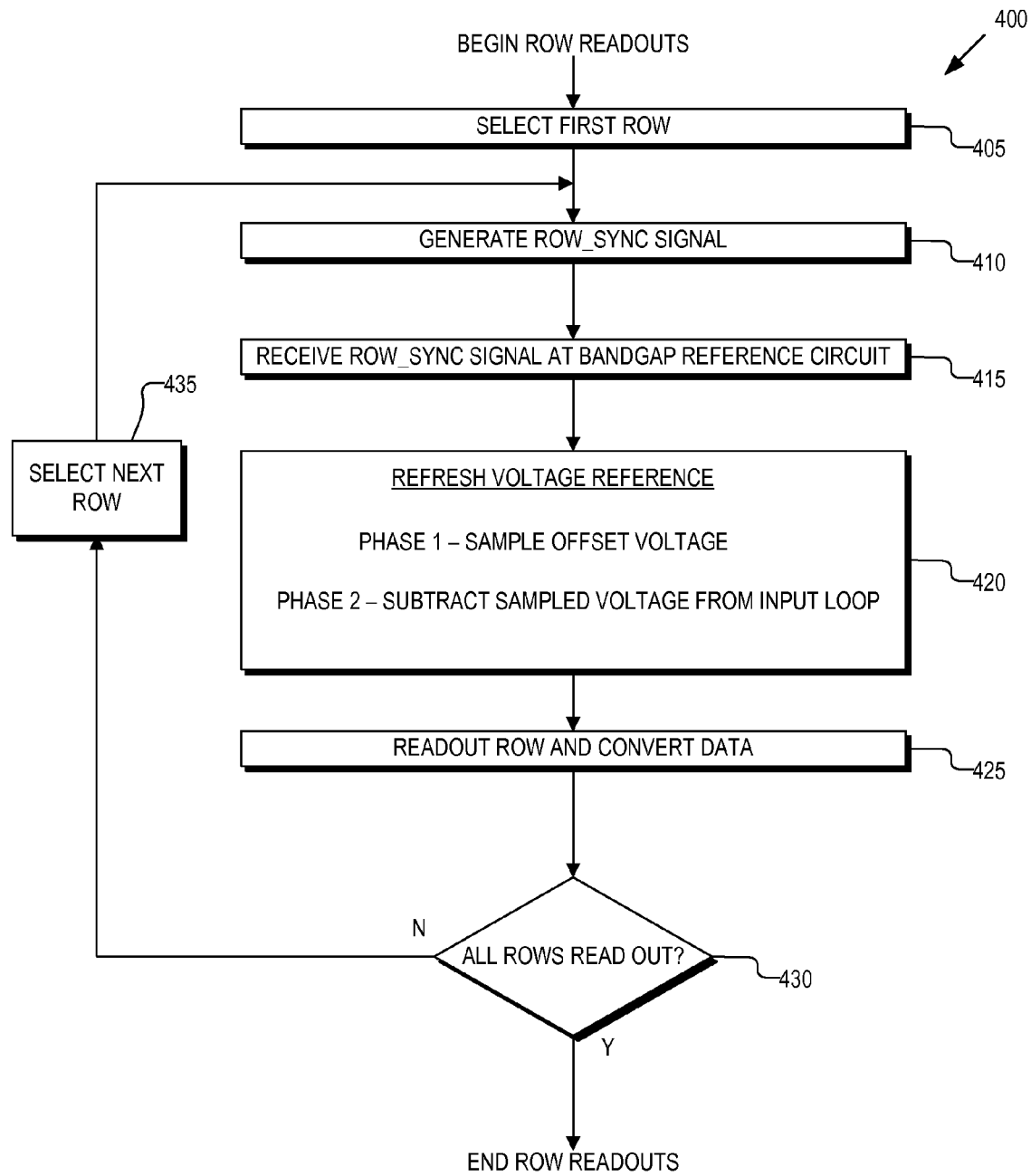
FIG. 4 is a flowchart illustrating the synchronized refresh of the bandgap reference circuit with the row readout of an image sensor, in accordance with an embodiment of the present disclosure.

Referring now back to FIG. 2, bandgap reference circuit 200 may include logic 204 for generating the signals 1, 2, and 3. As shown, logic 204 may generate signals 1, 2, and 3 in response to a row-synchronized input signal. In one embodiment, the row-synchronized input signal is a row_sync signal generated by the control circuitry 120 of image sensor 100, such that the voltage reference $V_{REF}$ is refreshed before the readout of each row of the image sensor. For example, FIG. 4 is a flowchart illustrating the synchronized refresh of the bandgap reference circuit with the row readout of an image sensor, in accordance with an embodiment of the present disclosure. Process 400 will be described with reference to FIGS. 1-4. In process block 405, control circuitry 120 selects a first row of pixel array 110 for readout. In doing do, control circuitry may generate a variety of control signals, including a row_sync signal to synchronize the readout of the row (process block 410). In process block 415, bandgap reference circuit 160 receives the row_sync signal. By way of example, the row-synchronized input signal to logic 204 of FIG. 2 may be the row_sync signal. In response, process block 420 includes the bandgap reference circuit refreshing the voltage reference generated by the bandgap reference circuit. Refreshing of the voltage reference includes the two phases previously discussed with reference to FIG. 3. That is, the first phase includes the sampling of the offset voltage $V_{OS}$ of OTA 202 onto the sampling capacitor $C_{OS}$. The second phase includes the voltage differential mode of operation of the OTA, where the sample voltage held on the sampling capacitor $C_{OS}$ is subtracted from input loop 210 to cancel the offset voltage $V_{OS}$ of OTA 202.

Next, in process block 425, the analog image data is readout to readout circuitry 130 and ADCs 118 convert the data using the voltage reference $V_{REF}$. In decision block 430 it is determined whether all rows have been readout. If so, process 400 ends the readout of the rows. If not, then process block 435 selects the next row for readout and process 400 repeats. Thus, the voltage reference generated by the bandgap reference circuit is refreshed each row readout of pixel array 110.

The image sensors disclosed herein may be included in a digital still camera, digital video camera, camera phone, picture phone, video phone, camcorder, webcam, camera in a computer system, security camera, medical imaging device, optical mouse, toy, game, scanner, automotive image sensor, or other types of electronic image and/or video acquisition device. Depending on the implementation, the electronic image and/or video acquisition device may also include other components, such as, for example, a light source to emit light, one or more lenses optically coupled to focus light on the array of pixels, a shutter optically coupled to allow light to pass through the one or more lenses, a processor to process image data, and a memory to store image data, to name just a few examples.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other. For example, a calibration circuit may be coupled with a column ADC circuit via an intervening switch.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the configurations, functions, and manner of operation and use, of the components of the embodiments. All equivalent relationships to those illustrated in the drawings and described in the specification are encompassed within embodiments. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

One or more embodiments include an article of manufacture (e.g., a computer program product) that includes a machine-accessible and/or machine-readable medium. The medium may include, a mechanism that provides, for example stores, information in a form that is accessible and/or readable by the machine. The machine-accessible and/or machine-readable medium may provide, or have stored thereon, one or more or a sequence of instructions and/or data structures that if executed by a machine causes or results in the machine performing, and/or causes the machine to perform, one or more or a portion of the operations or methods or the techniques shown in the figures disclosed herein.

In one embodiment, the machine-readable medium may include a tangible non-transitory machine-readable storage media. For example, the tangible non-transitory machine-readable storage media may include a floppy diskette, an optical storage medium, an optical disk, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, or a combinations thereof. The tangible medium may include one or more solid or tangible physical materials, such as, for example, a semiconductor material, a phase change material, a magnetic material, etc.

Examples of suitable machines include, but are not limited to, digital cameras, digital video cameras, cellular telephones, computer systems, other electronic devices having pixel arrays, and other electronic devices capable of capturing images. Such electronic devices typically include one or more processors coupled with one or more other components, such as one or more storage devices (non-transitory machine-readable storage media). Thus, the storage device of a given electronic device may stores code and/or data for execution on the one or more processors of that electronic device. Alternatively, one or more parts of an embodiment may be implemented using different combinations of software, firmware, and/or hardware.

It should also be appreciated that reference throughout this specification to "one embodiment", "an embodiment", or "one or more embodiments", for example, means that a particular feature may be included in the practice of the invention (e.g., in at least one embodiment). Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment.

What is claimed is:

1. A bandgap reference circuit, comprising:
   an operational transconductance amplifier (OTA) having an inverting input and a non-inverting input;
   a first switch coupled between the inverting input and an output of the OTA to provide a negative feedback loop around the OTA when the first switch is closed;
   a capacitor having a first end coupled to the inverting input, and a second end;
   a second switch coupled to the second end of the capacitor, wherein the capacitor is charged to a voltage substantially equal to an offset voltage of the OTA when the second switch is closed;
   a third switch coupled to the second end of the capacitor, wherein the voltage across the capacitor is subtracted from an input loop of the reference circuit to cancel the offset voltage of the OTA when the third switch is closed;
   a first bipolar transistor having a collector coupled to a first node between a first resistor and the third switch; and
   a second bipolar transistor having a collector coupled to a second node between a second resistor and the second switch, wherein the non-inverting input of the OTA is coupled to the second node, wherein the bandgap reference circuit is to be coupled to receive a first signal that synchronizes the readout of each row of a pixel array included in an imaging sensor, and wherein the bandgap reference circuit is configured to refresh the voltage reference during the readout of each row of the pixel array in response to the first signal.

2. The bandgap reference circuit of claim 1, wherein the refresh of the voltage reference includes:
   the closing of the second switch to charge the capacitor to the voltage substantially equal to the offset voltage of the OTA; and
   the closing of the third switch to subtract the voltage across the capacitor from the input loop of the reference circuit to cancel the offset voltage of the OTA.

3. The bandgap reference circuit of claim 1, wherein a base of the first bipolar transistor and a base of the second bipolar transistor are coupled to a voltage reference output of the bandgap reference circuit.

4. The bandgap reference circuit of claim 1, further comprising:
   a fourth switch having one end coupled to the output of the OTA;
   a source follower transistor having a control terminal coupled to a second end of the fourth switch, wherein the source follower transistor is configured to provide the voltage reference output to the bases of the first and second bipolar transistors when the fourth switch is closed.

5. The bandgap reference circuit of claim 4, wherein the source follower transistor is further coupled to receive a start pulse, wherein the source follow transistor is configured to provide the voltage reference output to the bases of the first and second bipolar transistors when the fourth switch is open and the start pulse is received.

6. The bandgap reference circuit of claim 4, further comprising logic coupled to generate:
a first control signal to control switching of the first switch;
a second control signal to control switching of the second switch; and
a third control signal to control switching of the third and fourth switches.

7. The bandgap reference circuit of claim 6, wherein the logic generates the control signals in a first phase and in a subsequent second phase, wherein the first phase includes the first and second switches closed and the third and fourth switches open, such that the second end of the capacitor is coupled to the second node to sample the offset voltage onto the capacitor.

8. The bandgap reference circuit of claim 7, wherein the second phase includes the first and second switches open and the third and fourth switches closed, such that the OTA senses a differential voltage between the first and second nodes and such that the voltage across the capacitor is subtracted from the input loop of the reference circuit to cancel the offset voltage of the OTA.

9. The bandgap reference circuit of claim 1, wherein the negative feedback loop around the OTA is a unity-gain negative feedback loop.

10. An image sensor for generating digital image data, the image sensor comprising:
a pixel array including a plurality of pixel cells arranged into rows and columns for capturing analog image data;
a bit line coupled to at least one of the pixels within a column of the pixel array;
control circuitry to generate a first signal to synchronize the readout of each row of the pixel array; and
readout circuitry coupled to the bit line to readout the analog image data from the at least one pixel, the readout circuitry including bandgap reference circuit for providing a voltage reference to an analog-to-digital converter (ADC), the bandgap reference circuit comprising:
an operational transconductance amplifier (OTA) having an inverting input and a non-inverting input;
a first switch coupled between the inverting input and an output of the OTA to provide a negative feedback loop around the OTA when the first switch is closed;
a capacitor having a first end coupled to the inverting input, and a second end;
a second switch coupled to the second end of the capacitor, wherein the capacitor is charged to a voltage substantially equal to an offset voltage of the OTA when the second switch is closed;
a third switch coupled to the second end of the capacitor, wherein the voltage across the capacitor is subtracted from an input loop of the reference circuit to cancel the offset voltage of the OTA when the third switch is closed;
a first bipolar transistor having a collector coupled to a first node between a first resistor and the third switch; and
a second bipolar transistor having a collector coupled to a second node between a second resistor and the second switch, wherein the non-inverting input of the OTA is coupled to the second node, wherein the bandgap reference circuit is coupled to receive the first signal and wherein the bandgap reference circuit refreshes the voltage reference with the readout of each row of the pixel array.

11. The image sensor of claim 10, wherein the bandgap reference circuit refreshing the voltage reference includes:
the closing of the second switch to charge the capacitor to the voltage substantially equal to the offset voltage of the OTA; and
the closing of the third switch to subtract the voltage across the capacitor from the input loop of the reference circuit to cancel the offset voltage of the OTA.

12. The image sensor of claim 10, wherein a base of the first bipolar transistor and a base of the second bipolar transistor are coupled to a voltage reference output of the bandgap reference circuit.

13. The image sensor of claim 10, wherein the bandgap reference circuit, further comprises:
a fourth switch having one end coupled to the output of the OTA;
a source follower transistor having a control terminal coupled to a second end of the fourth switch, wherein the source follower transistor is configured to provide the voltage reference to the bases of the first and second bipolar transistors when the fourth switch is closed.

14. The image sensor of claim 13, wherein the source follower transistor is further coupled to receive a start pulse, wherein the source follow transistor is configured to provide the voltage reference to the bases of the first and second bipolar transistors when the fourth switch is open and the start pulse is received.

15. The image sensor of claim 13, wherein the bandgap reference circuit, further comprises logic coupled to generate:
a first control signal to control switching of the first switch;
a second control signal to control switching of the second switch; and
a third control signal to control switching of the third and fourth switches.

16. The image sensor of claim 13, wherein the logic generates the control signals in a first phase and in a subsequent second phase, wherein the first phase includes the first and second switches closed and the third and fourth switches open, such that the second end of the capacitor is coupled to the second node to sample the offset voltage onto the capacitor.

17. The image sensor of claim 16, wherein the second phase includes the first and second switches open and the third and fourth switches closed, such that the OTA senses a differential voltage between the first and second nodes and such that the voltage across the capacitor is subtracted from the input loop of the reference circuit to cancel the offset voltage of the OTA.

18. The image sensor of claim 10, wherein the negative feedback loop around the OTA is a unity-gain negative feedback loop.

19. A method, comprising:
generating a first signal to synchronize the readout of each row of a pixel array included in an imaging sensor;
receiving the first signal at a bandgap reference circuit of the imaging sensor and refreshing a voltage reference generated by the bandgap reference circuit during the readout of each row of the pixel array in response thereto, wherein refreshing the voltage reference includes:
a first phase of sampling of a offset voltage VOS of an operational transconductance amplifier (OTA) included in the bandgap reference circuit; and
a second phase of subtracting the sampled voltage from an input loop of the bandgap reference circuit to cancel the offset voltage VOS of the OTA; and
converting the data readout from each row of the pixel array with an analog to digital converter, wherein the analog to digital converter uses the voltage reference to convert the data, wherein the bandgap reference circuit is to be coupled to receive a first signal that synchronizes the readout of each row of a pixel array included in an imaging sensor, and wherein the bandgap reference circuit is configured to refresh the voltage reference during the readout of each row of the pixel array in response to the first signal.

* * * * *